| United States Patent [19] | [11] Patent Number: 4,891,331 |
| --- | --- |
| Rapp | [45] Date of Patent: Jan. 2, 1990 |

[54] METHOD FOR DOPING SILICON WAFERS USING $AL_2O_3/P_2O_5$ COMPOSITION

[75] Inventor: James E. Rapp, Oregon, Ohio

[73] Assignee: OI-NEG TV Products, Inc., Toledo, Ohio

[21] Appl. No.: 146,503

[22] Filed: Jan. 21, 1988

[51] Int. Cl.$^4$ .......................................... H01L 21/225
[52] U.S. Cl. ...................................... 437/164; 252/950
[58] Field of Search ................ 252/950; 437/164, 168, 437/169

[56] References Cited

U.S. PATENT DOCUMENTS 3,303,070 2/1967 Schmidt et al. ..................... 437/164
3,354,005 11/1967 Lepiane et al. ..................... 437/164
3,914,138 10/1975 Rai-Choudhury .................. 437/152
3,998,668 12/1976 Florence et al. .................... 423/314
4,059,669 11/1977 Thomas ............................... 423/314
4,104,091 8/1978 Evans, Jr. et al. .................. 437/152

*Primary Examiner*—Olik Chaudhuri

[57] ABSTRACT

A doping composition and method for doping a silicon wafer with phosphorous in which the composition contains (A) a high purity $Al_2O_3/P_2O_5$ compound having a mole ratio of $P_2O_5/Al_2O_3$ of about 1/1 to 4/1: and (B) a vehicle for the $Al_2O_3/P_2O_5$ compound for application as a paste to provide a thin layer on the silicon wafer which is fired to provide an easily-removed powdery layer on the wafer.

11 Claims, No Drawings

METHOD FOR DOPING SILICON WAFERS USING AL₂O₃/P₂O₅ COMPOSITION

The present invention relates to a doping composition and method for doping a silicon wafer with phosphorous (P) using a high purity $Al_2O_3/P_2O_5$ compound.

BACKGROUND OF THE INVENTION

U.S. Pat. No.4,571,366 (Thomas and Tillman), assigned to Owens-Illinois, Inc., discloses a process for forming a doped oxide film and preparing a doped silicon semiconductor from the film. The process includes a polyorganosiloxane-dopant compound solution that is applied to a silicon wafer by a spin-on step. The resultant film is heated to provide a glassy dopant film that is further heated to impregnate the silicon wafer with the dopant including P, As or B. The glassy layer is then removed to provide the doped wafer. This patent (U.S. 4,571,366) is hereby incorporated by reference for the background information including the preparation of a doped silicon wafer and the method of testing the doped wafer including average Measured Resistances in Ohms/Square.

It is desirable, as an improvement in the art, to provide a powdery, easily applied film (merely applied by screen-printing) on the silicon wafer instead of having to form a glassy layer first. Hence, it is desirable to eliminate the use of the glassy layer and the accompanying diffusion tubes and spin-on equipment and thus provide a doping process suitable for a continuous process using a belt furnace.

It is also desirable to provide a doping process in which the doping film deposited on the silicon wafer is easily and quickly removed in a short time.

It is also desirable to provide a doping composition and method for doping a silicon wafer in which the composition is easily and efficiently deposited on the wafer, the resultant deposited doping film very easily removed, and the method resulting in a matte finish on the wafer surface, thereby eliminating a process step previously required to reduce the silicon surface reflectivity to produce a silicon surface for solar cells.

OBJECTS OF THE INVENTION

It is an object of the present invention to provide a doping composition comprising a high purity $Al_2O_3/P_2O_5$ compound and/or mixture of compounds that is easily and efficiently applied as an easily removed powdery layer on a silicon wafer, the doping composition being screenprintable and very quickly and easily removed after heat treating the powdery layer to impregnate the silicon wafer with P.

It is an object of the present invention to provide a method and doping composition for a silicon wafer, the doping composition comprising a high purity $Al_2O_3/P_2O_5$ compound and/or a mixture of such compounds and a vehicle therefor, the pasty composition being applied quickly and easily to a silicon wafer, the deposited composition forming a powdery doping film that is heated to impregnate the silicon wafer.

It is an object of the present invention to provide a method and a doping composition for doping a silicon wafer, the composition comprising:

(A) a high purity $Al_2O_3/P_2O_5$ material compound and/or a mixture of compounds containing a mole ratio of $P_2O_5$ to $Al_2O_3$ of about 1/1 to 4/1; and (B) a vehicle for the $Al_2O_3/P_2O_5$ materials to provide a doping composition for application in a thin layer to the silicon substate.

These and other objects will be apparent from the specification that follows and the appended claims.

SUMMARY OF THE INVENTION

The present invention provides a doping composition for doping a silicon wafer, the composition comprising:

(A) a high purity $Al_2O_3/P_2O_5$ material compound and/or mixture of compounds containing a mole ratio of $P_2O_5$ to $Al_2O_3$ of about 1/1 to 4/1; and (B) a vehicle for the $Al_2O_3/P_2O_5$ materials to provide a doping composition for application in a thin layer to the silicon substate.

The present invention also provides a method for doping a silicon wafer, the method comprising the steps of:

(A) forming a doping composition paste of (1) high purity $Al_2O_3/P_2O_5$ product in which the mole ratio of $P_2O_5$ to $Al_2O_3$ is about 1/1 to 4/1 in (2) a vehicle for the product.

(B) coating the silicon with the doping composition paste as a thin layer on the silicon wafer.

(C) heating the coating of step (B) to form a film for a time sufficient and a temperature sufficient to diffuse the phosphorous from the film into the silicon wafer.

Generally the molar ratio of $P_2O_5/Al_2O_3$ is about 1/1 to 4/1, the preferred ranges are about 1.1/1 or 1.25/1 up to 1.75/1 and also as low as about 2.25/1 up to 3.75/1. For some reason the molar ratio of $P_2O_5/Al_2O_3$ is not preferred at about 2/1 because it tends to excessively damage the silicon surface, but compounds less than 2/1 and more than 2/1 are preferred as just set forth. Excellent results are obtained at a molar ratio $P_2O_5/Al_2O_3$ of about 1.5/1 and about 3/1.

The following examples are intended to illustrate the present invention and not to limit it in any way.

EXAMPLE 1

A high purity $P_2O_5/Al_2O_3$ compound with a molar ratio of $P_2O_5/Al_2O_3$ of 3/1 was made as described in the Thomas U.S. Patent 4,059,669, assigned to Owens-Illinois, Inc., this patent being incorporated herein by reference.

As seen in Example 1 of U.S. 4,059,669, 3 moles of $P_2O_5$ (orthophosphoric acid) were reacted with one mole of $Al_2O_3$ (aluminum sec-butoxide) to provide a solid lumpy product. The $P_2O_5/Al_2O_3$ compound was then ground and screened through a 200 mesh screen.

EXAMPLE 2

For comparison with the high purity $P_2O_5/Al_2O_3$ product of Example 1, a glass was made with the following approximate mole percent:

| | |
|---|---|
| $P_2O_5$ | 62 |
| $Al_2O_3$ | 21 |
| CaO | 17 |

The glass was melted, solidified by fritting to provide flakes of glass that were ground and screened to less than 200 mesh.

EXAMPLE 3

The $P_2O_5/Al_2O_3$ product of Example 1 and the ground glass flakes of Example 2 were each mixed with a vehicle (butyl carbitol acetate and tripropylene glycol) to provide a paste.

The paste of the Example 1 product and the paste of the Example 2 glass were screen-printed on silicon wafers to provide a deposited layer that was dried to provide a powdery layer on each wafer. Each of the wafer with the deposited layer was fired at 875° C. for 20 minutes in a belt furnace (continuous process) to impregnate the wafer with phosphorous.

The doped silicon wafers were observed and tested as follows:

| | Printed Material After Firing | Silicon Surface Condition | Resistance Ohms/Square |
| --- | --- | --- | --- |
| Example 1 doped wafers | Good | Good | 473 |
| Example 2 doped wafers | Flaked | Pitting, Crazing | 102 |

The superiority of the Example 1 (high purity $P_2O_5$/$Al_2O_3$ material compound) doped wafers are clearly seen in the above table.

A solar cell was made using the Example 1 ($P_2O_5$/$Al_2O_3$ material) doped silicon wafers. The results were good and the performance curve good. In a plot of voltage versus current, at zero voltage, the current was 0.11 amps. At 0.2 and 0.4 volts, the amps were 0.112 and 0.08 respectively.

EXAMPLE 4

Powdered materials from Example 1 and Example 2 were blended with a vehicle (1:1 mixture of butyl carbitol acetate and tripropylene glycol with 5 wt.% ethyl cellulose). The final vehicle viscosity was adjusted to about $1-2 \times 10^5$ RPM (Brookfield) to provide a flowable screen printable paste. The mixture exhibits thixotropic properties. The wafers were screen printed through a 200 mesh screen.

The screen printed silicon wafers were dried at 100° C. for 25 minutes.

The dried wafers were then fired at 975° C. for 20 minutes.

The fired powdery surface from the paste of Example 1 was easily removed from the silicon wafer by etching in 30% HF for 30 seconds.

A silicon wafer with a deposited paste coating from the paste of Example 1 was fired at 900° C. for 1 hour. The resultant silicon wafer, with the powdery coating etched away, had a sheet resistivity of 120 ohms/square and a junction of 1 micron.

The preferred $P_2O_5$/$Al_2O_3$ materials often depend upon the application or use such as solar cells or power transistors or deep junction devices. By means of a series of tests, it was determined that for solar cells (and a deposited layer that is easily undercut) the preferred $P_2O_5$/$Al_2O_3$ compounds have a molar ratio of $Al_2O_3$ to $P_2O_5$ of about 1.225 to 1.275 and the firing temperature is about 850° C. to 1000° C. For solar cells, when undercutting is not required, the preferred molar ratio of $Al_2O_3$/$P_2O_5$ is about 1:1 to 1:1.75 and 1.275 to 1.40 and the firing temperature is about 800° C. or 850° C. up to 950° C. or 975° C.

Again, in solar cells, when a matte surface is desired, the preferred molar ratio is about 1:1 to 1.175 and 1:1.225 to 1:4 at a firing temperature of about 1000° C. to 1150° C.

For power transistors and deep junction devices, where surface condition or damage is not a great problem, the preferred $Al_2O_3$/$P_2O_5$ molar ratio is about 1:1 to 1:1.5 and the firing temperature is about 1150° C. to 1250° C.

Although not preferred because of surface problems in that the melted dopant powder is difficult to remove from the silicon surface, the suitable molar ratio of $Al_2O_3$ to $P_2O_5$ is about 1:2 to 1:4 and the firing temperature is about 1150° C. to 1175° C. or 1200° C. As previously indicated the ratio of $Al_2O_3$ to $P_2O_5$ of 1:2 is not preferred, it tending to show surface damage at all firing temperatures of 800° C. to 1250° C.

The tested materials were judged generally according to the following table:

| | Properties | | |
| --- | --- | --- | --- |
| Film (Deposited) Quality | Film Etch Time (Min.) | Film Etch Process | Surface Quality |
| Powdered (best) | less than 1 | Disintegrate | Good |
| Partial Melt Flake | | | Matte |
| Droplets (worst) | greater than 30 | Undercut film | Matte/Poor |
| | | Dissolve film | Matte/Pitted |
| | | | Very Poor Severe Damage |

In general, the molar ratios of $Al_2O_3$/$P_2O_5$ of 1/1.15 to 1/1.25 as well as ¼ to ¼ provided the best results, the paste from the ¼ ratio being the most difficult to put down on the silicon wafer. Also with the ¼ ratio, there is some damage starting to appear when the firing temperature reaches about 1100° C. or higher.

In general, the paste deposited powdery dopant layers on the silicon wafers of the present invention are very easily removed with merely a 10:1 HF solution. The HF quickly undercuts or disintegrates the powdery dopant layer. In contrast to this, spin-on dopant layers of the prior art generally have to be totally dissolved in HF in order to be removed.

As previously indicated, matte appearance of the phosphorous doped silicon wafer surfaces produced by the present invention, are highly advantageous for use in solar cells.

What is claimed is:

1. A method for doping a silicon wafer, the method comprising the steps of:
    (A) forming a flowable doping composition paste of
        (1) a $Al_2O_3$/$P_2O_5$ compound product in which the mole ratio of $P_2O_5$ to $Al_2O_3$ is about 1/1 to 4/1 in
        (2) a vehicle for the product to provide a paste, the compound being a reaction product of phosphoric acid or phosphorous acid and an organic aluminum compound or a hydrolyzed derivative thereof;
    (B) coating the silicon with the doping composition paste as a thin powdery layer on the silicon wafer without vapor transport; and
    (C) heating the coating of step (B) without forming a glassy layer for a time sufficient and a temperature at about 800° C. to 1250° C. that is sufficient to diffuse the phosphorus from the powdery layer into the silicon wafer.

2. A method as defined in claim 1 in which the heating is at about 850° C. to 1000° C. and the ratio is about 1.225/1 to 1.275/1.

3. A method as defined in claim 1 in which the heating is at about 1150° C. to 1250° C. and the ratio is about 1.1/1 to 1.5/1.

4. A method as defined in claim 1 in which the ratio is about 2.1/1 to 4/1.

5. A method as defined in claim 1 in which step (B) is screen printing the composition.

6. A method as defined in claim 1 in which the ratio is 1/1.

7. A method as defined in claim 1 in which the ratio is 3/1.

8. A method as defined in claim 1 in which the ratio is 4/1.

9. A method as defined in claim 1 in which the ratio is about 1/1 to 1.75/1 and the heating is at about 800° C. to 975° C.

10. A method as defined in claim 1 in which step (C) is a step of continuously heating a plurality of moving coated silicon wafers.

11. A method as defined in claim 1 in which there is a further step of etching the heated layer from the silicon wafer.

* * * * *